(12) United States Patent
Kim

(10) Patent No.: US 12,413,229 B2
(45) Date of Patent: Sep. 9, 2025

(54) SEMICONDUCTOR DEVICE

(71) Applicant: SAMSUNG ELECTRONICS CO., LTD., Suwon-si (KR)

(72) Inventor: Minsu Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/241,555

(22) Filed: Sep. 1, 2023

(65) Prior Publication Data

US 2024/0080027 A1    Mar. 7, 2024

(30) Foreign Application Priority Data

Sep. 6, 2022 (KR) .................. 10-2022-0112599

(51) Int. Cl.
*H03K 19/00* (2006.01)
*H01L 27/02* (2006.01)
*H03K 3/356* (2006.01)
*H03K 19/0185* (2006.01)
*H10D 89/10* (2025.01)

(52) U.S. Cl.
CPC ... *H03K 19/0016* (2013.01); *H03K 3/356121* (2013.01); *H03K 19/018521* (2013.01); *H10D 89/10* (2025.01)

(58) Field of Classification Search
None
See application file for complete search history.

(56) References Cited

U.S. PATENT DOCUMENTS

| | | | |
|---|---|---|---|
| 9,013,235 B2 | 4/2015 | Kamal et al. | |
| 9,041,448 B2 | 5/2015 | Du et al. | |
| 9,098,666 B2* | 8/2015 | Samadi | G06F 30/394 |
| 9,418,985 B2 | 8/2016 | Du | |
| 9,628,077 B2* | 4/2017 | Xie | H03K 19/0021 |
| 10,599,806 B2 | 3/2020 | Xu et al. | |
| 11,295,053 B2 | 4/2022 | Xu et al. | |

FOREIGN PATENT DOCUMENTS

JP    5063958 B2    10/2012

* cited by examiner

*Primary Examiner* — Kenneth B Wells
(74) *Attorney, Agent, or Firm* — Fish & Richardson P.C.

(57) ABSTRACT

A semiconductor device includes: a first layer including a first semiconductor substrate, a plurality of first standard cell regions defined in the first semiconductor substrate, and a plurality of first standard cells disposed in the plurality of first standard cell regions; and a second layer including a second semiconductor substrate, a plurality of second standard cell regions defined in the second semiconductor substrate, and a plurality of second standard cells disposed in the plurality of second standard cell regions, the second layer being stacked with the first layer in a vertical direction perpendicular to an upper surface of the first semiconductor substrate, wherein the plurality of first standard cells provide combinational logic circuits, and the plurality of second standard cells provide at least some of sequential logic circuits, a clock gate circuit, a power circuit, and a level shifter circuit.

20 Claims, 13 Drawing Sheets

SEMICONDUCTOR DEVICE

CROSS-REFERENCE TO RELATED APPLICATION(S)

This application claims the benefit of priority to Korean Patent Application No. 10-2022-0112599 filed on Sep. 6, 2022 in the Korean Intellectual Property Office, the disclosure of which is incorporated herein by reference in its entirety.

BACKGROUND

The present inventive concept relates to a semiconductor device.

A semiconductor device may include various circuits required to perform calculations. In order to improve the performance of the semiconductor device and reduce the power consumption of the semiconductor device, a three-dimensional semiconductor device in which some of the circuits included in the semiconductor device are disposed in different layers in a distributed manner and in which the layers are stacked has been proposed. In the three-dimensional semiconductor device, at least some of the circuits included in the different layers are connected to each other by interlayer vias to exchange power supply voltages and/or signals required for operation. By efficiently designing power supply voltage transfer paths and signal transmission paths, the performance of the semiconductor device can be improved and the power consumption of the semiconductor device can be reduced.

SUMMARY OF THE INVENTION

Exemplary embodiments of the invention provide a semiconductor device having maximally improved performance and maximally reduced power consumption, by disposing combinational logic circuits and sequential logic circuits separately in different layers, or by disposing circuits formed in well regions, isolated from each other in different layers.

According to exemplary embodiments, a semiconductor device includes: a first layer including a first semiconductor substrate, a plurality of first standard cell regions defined in the first semiconductor substrate, a plurality of first standard cells disposed in the plurality of first standard cell regions, and a plurality of first interlayer via regions disposed between some of the plurality of first standard cell regions; and a second layer including a second semiconductor substrate, a plurality of second standard cell regions defined in the second semiconductor substrate, a plurality of second standard cells disposed in the plurality of second standard cell regions, and a plurality of second interlayer via regions disposed between some of the plurality of second standard cell regions, the second layer being stacked with the first layer in a vertical direction perpendicular to an upper surface of the first semiconductor substrate, wherein the plurality of first standard cells provide combinational logic circuits, and the plurality of second standard cells provide sequential logic circuits, a clock gate circuit, a power circuit, and a level shifter circuit.

According to other exemplary embodiments, a semiconductor device includes: a first layer including a first semiconductor substrate and a plurality of first semiconductor elements disposed on the first semiconductor substrate; and a second layer stacked with the first layer in a direction perpendicular to an upper surface of the first semiconductor substrate, and including a second semiconductor substrate and a plurality of second semiconductor elements disposed on the second semiconductor substrate, wherein a spacing between gate structures included in the plurality of first semiconductor elements is equal to a spacing between gate structures included in the plurality of second semiconductor elements, the plurality of first semiconductor elements and the plurality of second semiconductor elements implement combinational logic standard cells providing combinational logic circuits and sequential logic standard cells providing sequential logic circuits, and the number of combinational logic standard cells included in the first layer is larger than the number of combinational logic standard cells included in the second layer.

According to further exemplary embodiments, a semiconductor device includes: a plurality of first standard cells arranged in a direction parallel to an upper surface of a first semiconductor substrate, and including a plurality of first combinational logic standard cells providing combinational logic circuits and a plurality of first sequential logic standard cells providing sequential logic circuits; and a plurality of second standard cells stacked with the plurality of first standard cells in a vertical direction perpendicular to the upper surface of the first semiconductor substrate, and including a plurality of second combinational logic standard cells providing combinational logic circuits and a plurality of second sequential logic standard cells providing sequential logic circuits, wherein an area of the plurality of first combinational logic standard cells is larger than an area of the plurality of second combinational logic standard cells, and an area of the plurality of first sequential logic standard cells is smaller than an area of the plurality of second sequential logic standard cells.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION OF THE INVENTION

Hereinafter, preferred exemplary embodiments of the present disclosure will be described with reference to the accompanying drawings.

Figure 1:
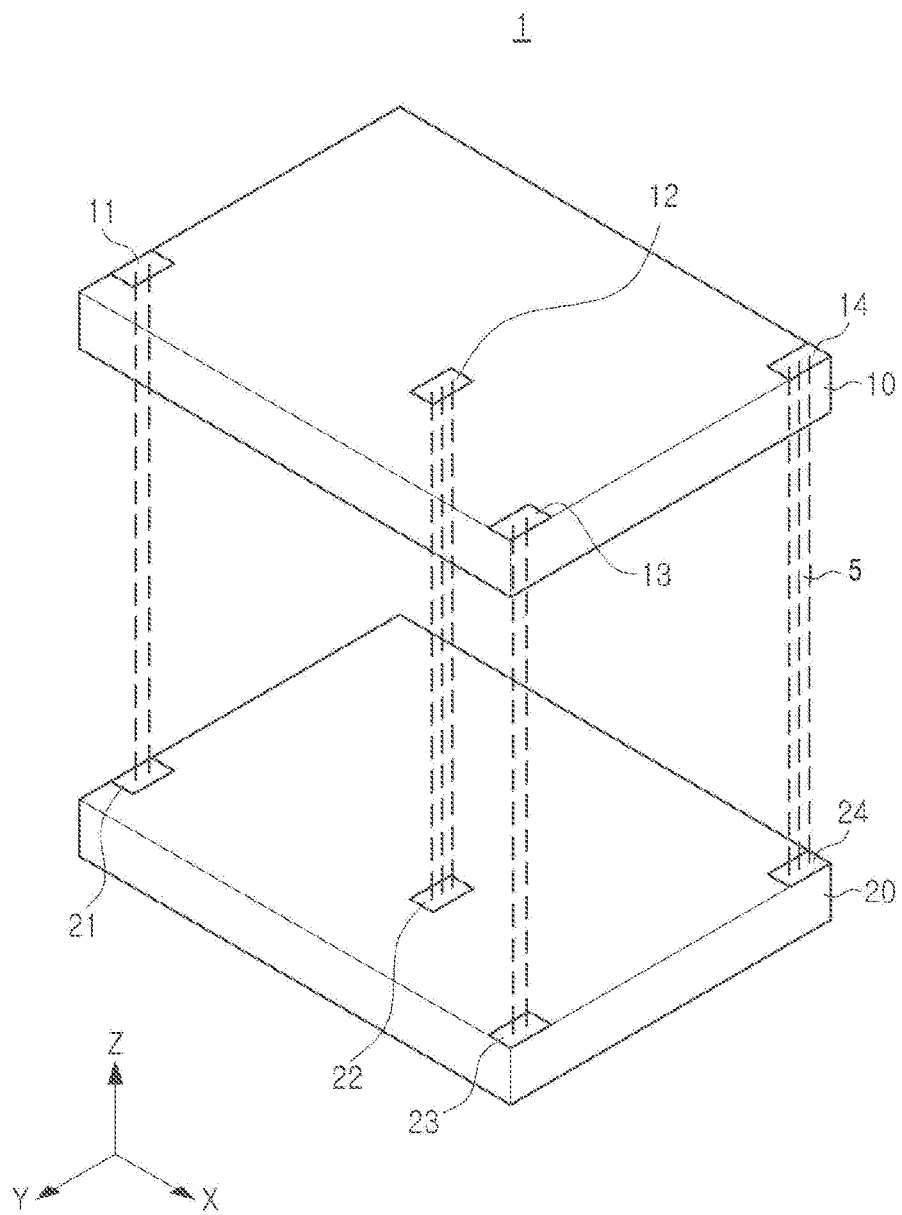
FIG. 1 is a diagram schematically illustrating a semiconductor device according to an exemplary embodiment of the present disclosure.

FIG. 1 is a diagram schematically illustrating a semiconductor device according to an exemplary embodiment of the present disclosure.

Referring to FIG. 1, a semiconductor device 1 according to an exemplary embodiment of the present disclosure may include a first layer 10 and a second layer 20. The first layer 10 may include circuits provided by a plurality of elements formed on a first semiconductor substrate, and the second layer 20 may include circuits provided by a plurality of elements formed on a second semiconductor substrate. The first semiconductor substrate and the second semiconductor substrate may be separate substrates, and the first layer 10 and the second layer 20 may be stacked in a vertical direction (Z-axis direction) perpendicular to upper surfaces of the first semiconductor substrate and the second semiconductor substrate.

The first layer 10 and the second layer 20 may provide one semiconductor device 1. Therefore, the semiconductor device 1 may be defined as a monolithic 3D integrated circuit (IC). The first layer 10 and the second layer 20 may operate in a coupled state to function as the semiconductor device 1, and may be connected to each other by separate interlayer vias 5 as illustrated in FIG. 1.

The interlayer vias 5, which are vias having a width of several tens of nanometers or less, may penetrate through at least one of the first semiconductor substrate and the second semiconductor substrate. For example, the interlayer vias 5 may be defined as monolithic inter vias (MIVs). The interlayer vias 5 may be connected to at least some of wiring patterns formed of a metal material in each of the first layer 10 and the second layer 20.

Referring still to FIG. 1, each of the first layer 10 and the second layer 20 may include a plurality of interlayer via regions 11 to 14 or 21 to 24, and the interlayer vias 5 may be disposed in the plurality of interlayer via regions 11 to 14 and 21 to 24. Positions where the plurality of first interlayer via regions 11 to 14 are disposed in the first layer 10 may correspond to positions where the plurality of second interlayer via regions 21 to 24 are disposed in the second layer 20, respectively. In other words, in the vertical direction in which the first layer 10 and the second layer 20 are stacked, the plurality of first interlayer via regions 11 to 14 and the plurality of second interlayer via regions 21 to 24 may overlap each other.

For example, the semiconductor device 1 may include combinational logic circuits and sequential logic circuits. The combinational logic circuit may be a circuit of which an output value is determined only based on an input value, and may operate without being synchronized with a clock signal. The sequential logic circuit is a circuit of which an output value is influenced by not only an input value but also other previously input values, and may operate in synchronization with a clock signal.

In an exemplary embodiment of the present disclosure, the combinational logic circuits and the sequential logic circuits may be separately disposed in the first layer 10 and the second layer 20 in a distributed manner. For example, when the combinational logic circuits are mainly disposed in the first layer 10, most of the sequential logic circuits may be disposed in the second layer 20. By separately disposing the sequential logic circuits, of which unit circuits occupy a relatively large area, in a different layer from the combinational logic circuits, the degree of integration of the semiconductor device 1 can be improved.

In addition, by disposing the sequential logic circuits each operating in synchronization with a clock signal in a separate layer, a clock signal transmission path can be formed in one layer. Furthermore, the length of the clock signal transmission path can be reduced, thereby reducing power consumption and improving the performance of the semiconductor device 1.

In addition, in an exemplary embodiment of the present disclosure, circuits having elements formed in well regions that need to be isolated from each other may be disposed on the first layer 10 and the second layer 20 in a distributed manner. For example, circuits having elements operating by receiving a first power supply voltage may be mainly disposed on the first layer 10, and circuits having elements operating by receiving a second power supply voltage may be mainly disposed on the second layer 20. In this case, a region required for isolating the well regions from each other may be omitted in the first layer 10, thereby improving the degree of integration of the semiconductor device 1.

Meanwhile, in an exemplary embodiment of the present disclosure, paths for transmitting various signals required to operate the sequential logic circuits, such as a reset signal, a scan enable signal, a scan connection signal, and a retention signal, may be disposed in the same layer as the sequential logic circuits. For example, a buffer circuit for transmitting signals required to operate the sequential logic circuits may be disposed in the same layer as the sequential logic circuits. As a result, it is possible to prevent a reset signal, a scan enable signal, a scan connection signal, a retention signal, and the like from being transmitted between different layers, thereby improving the performance of the semiconductor device 1.

Figure 2:
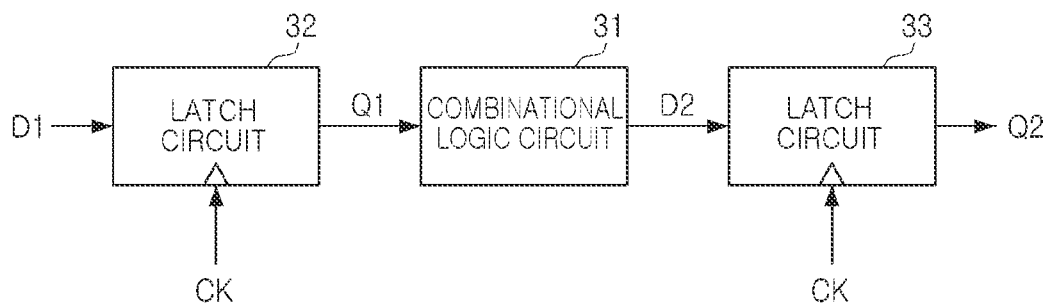
FIGS. 2 and 3 are block diagrams provided to describe a structure of a semiconductor device according to an exemplary embodiment of the present disclosure.
Figure 3:
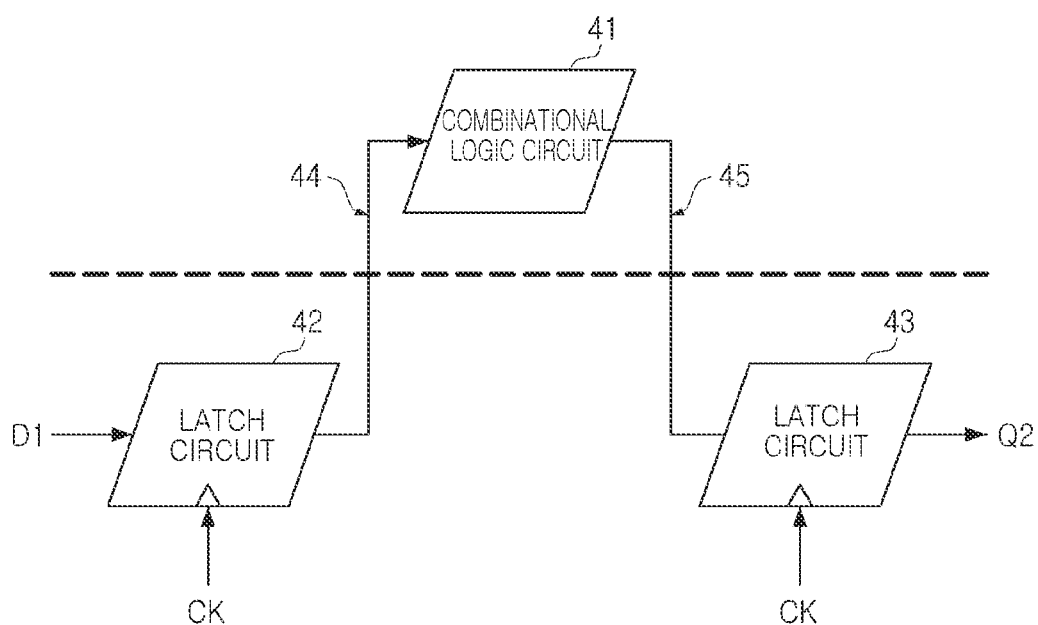

FIGS. 2 and 3 are block diagrams provided to describe a structure of a semiconductor device according to an exemplary embodiment of the present disclosure.

Referring to FIG. 2, the semiconductor device 30 may include a combinational logic circuit 31 and latch circuits 32 and 33. Each of the latch circuits 32 and 33 may operate in synchronization with a clock signal CK. For example, the first latch circuit 32 may store a first input D1 in synchronization with the clock signal CK, and output the same as a first output Q1.

The combinational logic circuit 31 may receive the first output Q1 from the first latch circuit 32, and execute a predetermined operation, for example, using the first output Q1. The combinational logic circuit 31 may be a circuit of which an output is determined based on a current input regardless of other clock signals or previous inputs, such as an adder, a multiplier, an encoder, or a multiplexer. In other words, in an exemplary embodiment illustrated in FIG. 2, a second input D2 transmitted to the second latch circuit 33 by the combinational logic circuit 31 may be determined based on the first output Q1 input to the combinational logic circuit 31.

Similarly to the first latch circuit 32, the second latch circuit 33 may operate in synchronization with a clock signal CK, store the second input D2 received from the combinational logic circuit 31, and reflect the same in a second output Q2. In the semiconductor device 30 according to an exemplary embodiment illustrated in FIG. 2, all semiconductor elements constituting the combinational logic circuit 31 and the latch circuits 32 and 33 may be formed in a single semiconductor substrate. Therefore, a transmission path for transmitting the clock signal CK to each of the latch circuits 32 and 33 needs to be relatively long, resulting in an increase in power consumption required to operate the semiconductor device 30 and a deterioration in performance. In addition, the degree of complexity of wiring patterns providing a path for transmitting the clock signal CK may increase, thereby decreasing the degree of integration of the semiconductor device 30.

In a semiconductor device 40 according to an exemplary embodiment of the present disclosure, as illustrated in FIG. 3, a combinational logic circuit 41 operating regardless of a clock signal CK may be formed separately from latch circuits 42 and 43 each operating by receiving a clock signal CK. For example, semiconductor elements for implementing the combinational logic circuit 41 may be formed in a first semiconductor substrate, and semiconductor elements for implementing the latch circuits 42 and 43 may be formed in a second semiconductor substrate different from the first semiconductor substrate.

As a result, the length of the transmission path for transmitting the clock signal CK to each of the latch circuits 42 and 43 can be shortened, the power consumption of the semiconductor device 40 can be reduced, and wiring patterns can be simply designed. Also, by separately forming the combinational logic circuit 41 and the latch circuits 42 and 43 in the different semiconductor substrates, the degree of integration of the semiconductor device 40 can be improved.

Referring to FIG. 3, the combinational logic circuit 41 may be connected to the latch circuits 42 and 43 through interlayer vias 44 and 45, respectively. When the first latch circuit 42 reflects a first input D1 in a first output Q1 in synchronization with a clock signal CK, the combinational logic circuit 41 may receive the first output Q1 through the first interlayer via 44, and execute a predetermined operation based thereon. A second input D2 output by the combinational logic circuit 41 may be input to the second latch circuit 43 through the second interlayer via 45, and the second latch circuit 43 may reflect the second input D2 in a second output Q2 in synchronization with a clock signal CK.

Meanwhile, not only the clock signals CK but also various other signals may be further required to operate sequential logic circuits such as the latch circuits 42 and 43. In an exemplary embodiment of the present disclosure, paths for transmitting retention signals, scan enable signals, and the like, in addition to the clock signals CK, to be input to the sequential logic circuits may also be disposed in the same layer as the sequential logic circuits, separately from the combinational logic circuit 41.

Figure 4:
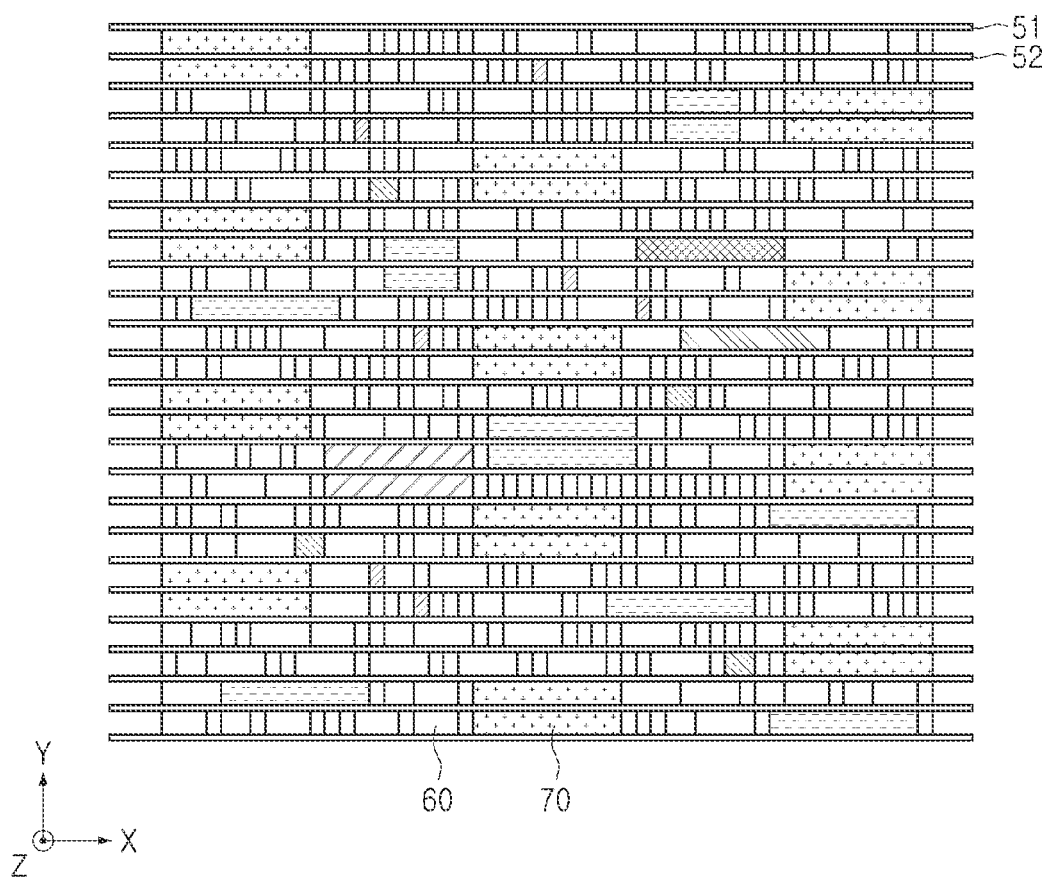
FIGS. 4 to 6 are diagrams provided to describe a structure of a semiconductor device according to an exemplary embodiment of the present disclosure.
Figure 5:
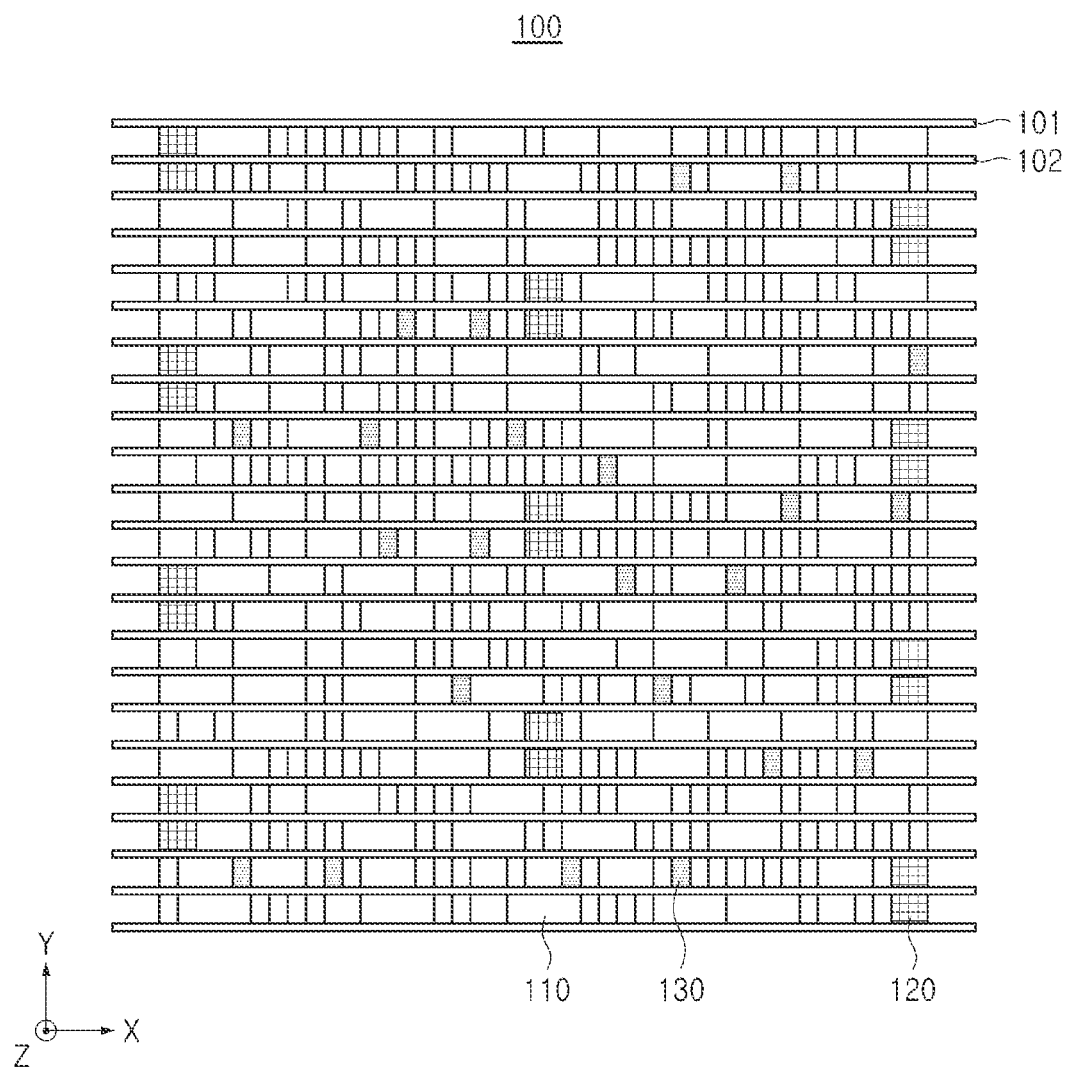
Figure 6:
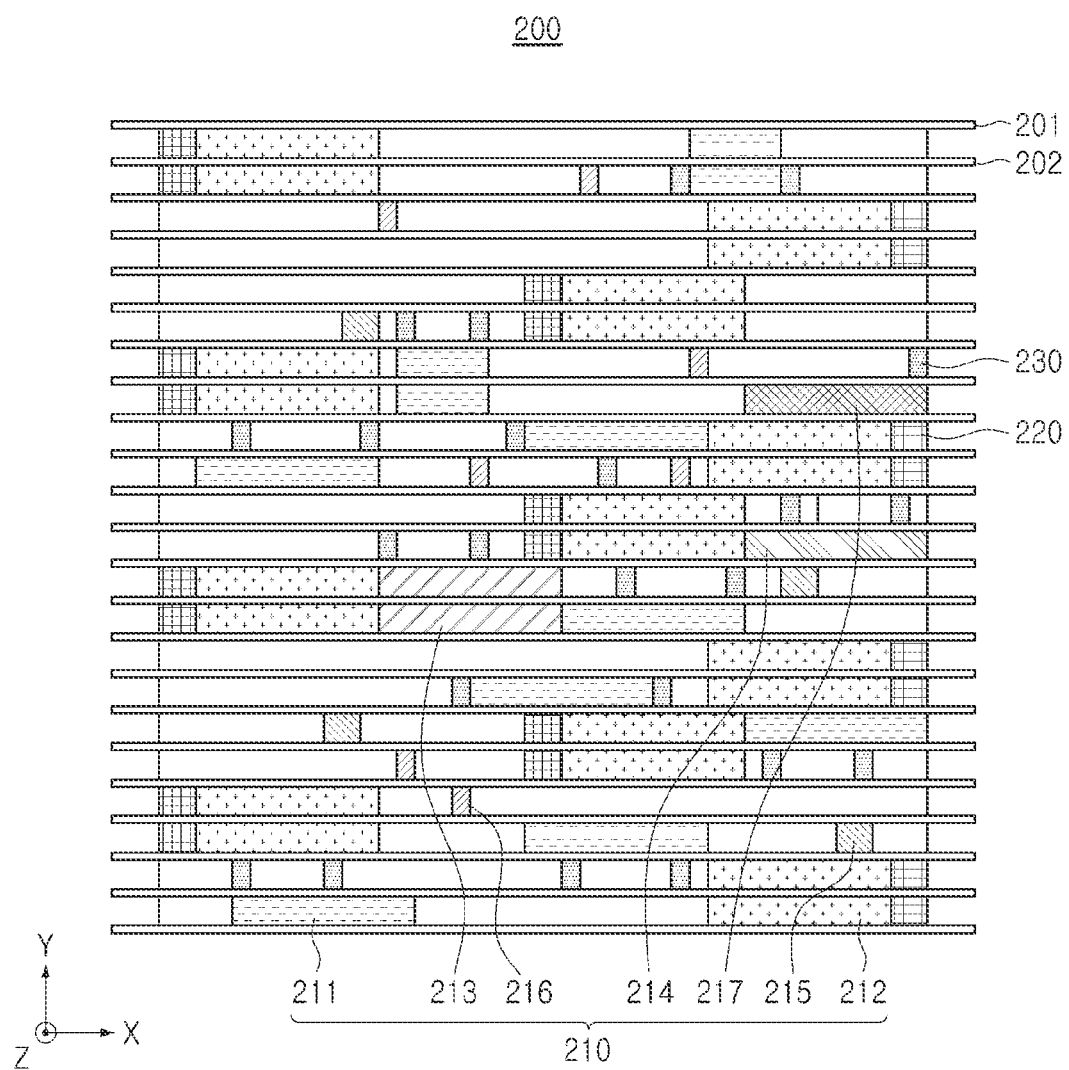

FIGS. 4 to 6 are diagrams provided to describe a structure of a semiconductor device according to an exemplary embodiment of the present disclosure.

FIG. 4 is a diagram schematically illustrating a structure of a semiconductor device 50 according to a comparative example. Referring to FIG. 4, the semiconductor device 50 may include a plurality of standard cells arranged along a first direction (X-axis direction) and a second direction (Y-axis direction), and a plurality of power supply voltage lines 51 and a plurality of reference voltage lines 52 extending in the first direction. While the plurality of power supply voltage lines 51 and the plurality of reference voltage lines 52 may be alternately arranged, the plurality of power supply voltage lines 51 may supply a first power supply voltage, and the plurality of reference voltage lines 52 may supply a reference voltage lower than the first power supply voltage.

The plurality of standard cells may be divided into first standard cells 60 and second standard cells 70. Each of the first standard cells 60 may provide a combinational logic circuit, and each of the second standard cells 70 may provide a sequential logic circuit, a clock gating circuit, a power supply circuit, or the like. Each of the first standard cells 60 may provide a circuit that operates without being synchronized with a clock signal and executes a predetermined operation, and each of the second standard cells 70 may provide a circuit that operates by receiving a clock signal, a circuit formed in a separate doped region to receive a power supply voltage having a different level from the first power supply voltage and the second power supply voltage.

On the other hand, FIGS. 5 and 6 are diagrams schematically illustrating respective structures of a first layer 100 and a second layer 200 included in a semiconductor device according to an exemplary embodiment of the present disclosure. The first layer 100 may include a first semiconductor substrate, the second layer 200 may include a second semiconductor substrate, and the first layer 100 and the second layer 200 may be stacked in a vertical direction (Z-axis direction) perpendicular to an upper surface of the first semiconductor substrate.

Referring to FIG. 5 first, the first layer 100 may include a plurality of first standard cells 110 and a plurality of first interlayer via regions 120 and 130 arranged along a first direction (X-axis direction) and a second direction (Y-axis direction). In addition, the first layer 100 may include a plurality of power supply voltage lines 101 and a plurality of reference voltage lines 102 extending in the first direction. The plurality of power supply voltage lines 101 and the plurality of reference voltage lines 102 may be alternately disposed along the second direction.

Each of the plurality of first standard cells 110 may provide a combinational logic circuit that operates regardless of a separate clock signal. The plurality of first interlayer via regions 120 and 130 may include first power supply via regions 120 and first input/output via regions 130. For example, a power supply voltage may be transmitted between the first layer 100 and the second layer 200 through power supply interlayer vias disposed in the first power supply via regions 120, respectively. Also, an input signal and/or an output signal may be transmitted between the first layer 100 and the second layer 200 through input/output interlayer vias disposed in the first input/output via regions 130, respectively.

Referring to FIG. 6, the second layer 200 may include a plurality of second standard cells 210 and a plurality of second interlayer via regions 220 and 230. Similar to the first layer 100, the second layer 200 may also include a plurality of power supply voltage lines 201 and a plurality of reference voltage lines 202. The plurality of power supply voltage lines 201 and the plurality of reference voltage lines 202 may be alternately disposed in the second direction.

The plurality of second standard cells 210 may include a memory circuit 211, power supply circuits 212 and 213, a clock gate circuit 214, buffer circuits 215 to 217, and the like. The memory circuit 211 may include a latch and/or a flip-flop, and the power supply circuits 212 and 213 may include a power gate circuit 212 and a power supply buffer 213. In an exemplary embodiment, the power supply buffer 213 may include a level shifter circuit or the like. For example, at least some of semiconductor elements providing the power supply circuits 212 and 213 may be formed in a separate well region isolated from a well region in which the other semiconductor elements are formed.

In an exemplary embodiment, the semiconductor elements included in the plurality of first standard cells 110 may be formed in a first well region, and at least some of the semiconductor elements providing the power supply circuits 212 and 213 may be formed in a second well region isolated from the first well region. The first well region and the second well region may be isolated from each other by an isolation region therebetween. In an exemplary embodiment of the present disclosure, by disposing such semiconductor elements to be formed in well regions that need to be isolated from each other mainly in the second layer 200, the first layer 100 may not include an isolation region for isolating the first and second well regions from each other. As a result, the degree of integration of the semiconductor device can be improved.

For example, the semiconductor elements formed in the second well region may receive a power supply voltage through a different path from the semiconductor elements formed in the first well region. The semiconductor elements formed in the first well region may receive a voltage required for operation through the plurality of power supply voltage lines 201 and the plurality of reference voltage lines 202 that are alternately disposed. On the other hand, the semiconductor elements formed in the second well region may receive a voltage required for operation through a path different from the plurality of power supply voltage lines 201.

When the semiconductor elements formed in the first well region receive a first power supply voltage from the plurality of power supply voltage lines 201, the semiconductor elements formed in the second well region may receive a second power supply voltage from a separate path different from the plurality of power supply voltage lines 201. Depending on what circuits the semiconductor elements formed in the second well region provide, the second power supply voltage may have a higher level or a lower level than the first power supply voltage. Alternatively, in certain exemplary embodiments, the second power supply voltage may have substantially the same level as the first power supply voltage.

The clock gate circuit 214, which is a circuit capable of controlling whether to supply a clock signal according to the operation of the semiconductor device, may be disposed in the second layer 200 together with the memory circuit 211 such as a latch or a flip-flop operating by receiving a clock signal. As a result, the degree of integration of the semiconductor device can be improved, and the design of wiring patterns providing a clock signal transmission path can be simplified. The buffer circuits 215 to 217, which are circuits including various buffers, inverters, and the like for transmitting signals, may include, for example, a clock buffer circuit 215 for transmitting a clock signal, a scan buffer circuit 216 for transmitting a scan signal, a repeater circuit 217, and the like.

For example, a scan chain circuit for testing at least some of the combinational logic circuits disposed in the first layer 100 may be disposed in the second layer 200. The scan chain circuit may include a plurality of latches, and a scan multiplexer selecting one of an input signal of a combinational logic circuit to be tested and a scan connection signal for transferring the selected signal to the plurality of latches. The scan chain circuit may be connected to paths for a scan connection signal, a scan output signal, and a scan enable signal. In an exemplary embodiment of the present disclosure, each of the scan connection signal, the scan output signal, and the scan enable signal may be transferred to the scan chain circuit by the buffer circuit 215 to 217 disposed in the second layer 200.

Meanwhile, the buffer circuits 215 to 217 may also provide paths for transmitting a reset signal and a set signal input to latches, flip-flops, and the like disposed in the second layer 200. In addition, in a case where at least some of the memory circuits 211 disposed in the second layer 200 provide retention flip-flops, paths for transmitting retention signals as well as input signals input to the retention flip-flops, scan enable signals, scan connection signals, and clock signals may also be provided by the buffer circuits 215 to 217.

Meanwhile, as illustrated in FIG. 6, the second layer 200 of the semiconductor device according to an exemplary embodiment of the present disclosure may include a plurality of second interlayer via regions 220 and 230. The plurality of second interlayer via regions 220 and 230 may include second power supply via regions 220 and second input/output via regions 230. The position where the second power supply via regions 220 are disposed in the second layer 200 may be the same as the positions where the first power supply via regions 120 are disposed in the first layer 100. Similarly, positions where the second input/output via regions 230 are disposed in the second layer 200 may be the same as the positions where the first input/output via regions 120 are disposed in the first layer 100.

As described with reference to FIGS. 5 and 6, in the semiconductor device according to an exemplary embodiment of the present disclosure, combinational logic circuits may be mainly disposed in the first layer 100, and sequential logic circuits, power supply circuits, clock gate circuits, and the like may be mainly disposed in the second layer 200. Since the circuits each operating by receiving a clock signal are disposed in the second layer 200, the clock signal transmission path can be formed only in the second layer 200. Therefore, the clock signal transmission path can be formed to be shorter than that in the comparative example described with reference to FIG. 4, resulting in an improvement in response speed of the semiconductor device and a decrease in power consumption.

Meanwhile, when a combinational logic circuit and a sequential logic circuit need to be connected to each other, the interlayer vias disposed in the first interlayer via regions 120 and 130 and the second interlayer via regions 220 and 230 may be utilized. Since the first standard cells 110 providing a combinational logic circuit are intensively disposed in the first layer 100 and the second standard cells 210 are intensively disposed in the second layer 200, the same circuit block can be implemented in a smaller area, thereby improving the degree of integration of the semiconductor device.

In an exemplary embodiment of the present disclosure, paths for transmitting signals required to operate the sequential logic circuits may be disposed in the second layer 200 together with the sequential logic circuits. For example, buffer circuits for transmitting clock signals, retention signals, scan enable signals, reset signals, and the like, and wiring patterns providing paths for transmitting the same may be disposed in the second layer 200. As a result, the lengths of the paths for transmitting signals required to operate the sequential logic circuits can be shortened, thereby improving the performance of the semiconductor device.

In addition, as described above, in the semiconductor device according to an exemplary embodiment of the present disclosure, semiconductor elements formed in doped regions including impurities of different concentrations may be mainly disposed in the second layer 200. For example, semiconductor elements receiving a second power supply voltage different from the first power supply voltage supplied by the plurality of power supply voltage lines 201 may be mainly formed in the second layer 200. In this case, since regions doped with impurities of different concentrations may not be formed in the first layer 100, in which standard cells are disposed at a relatively high density, the degree of integration of the semiconductor device can be improved. However, the present disclosure is not limited thereto. In certain exemplary embodiments, at least some of the semiconductor elements formed in the doped regions including impurities of different concentrations may be disposed in the first layer 100 if necessary.

Figure 7:
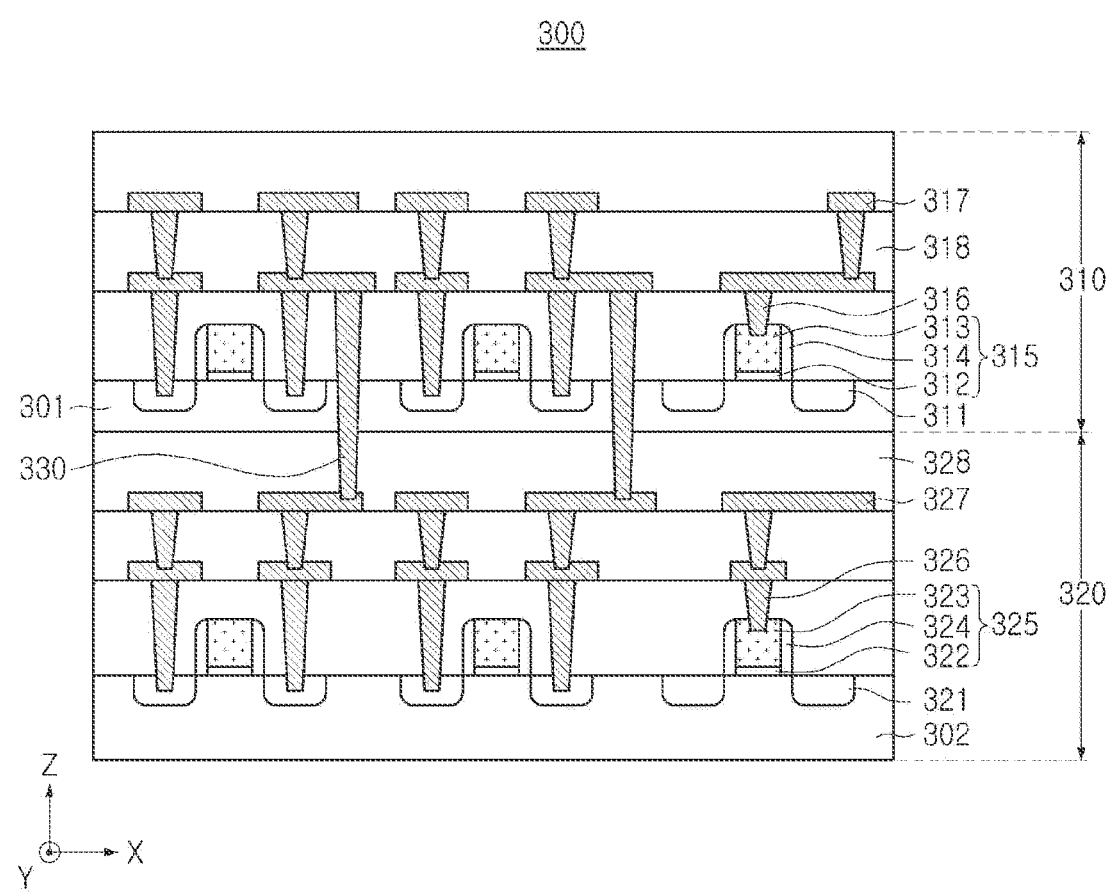
FIG. 7 is a diagram schematically illustrating a semiconductor device according to an exemplary embodiment of the present disclosure.

FIG. 7 is a diagram schematically illustrating a semiconductor device according to an exemplary embodiment of the present disclosure.

Referring to FIG. 7, a semiconductor device 300 according to an exemplary embodiment of the present disclosure may include a first layer 310 and a second layer 320. The first layer 310 may include a first semiconductor substrate 301, the second layer 320 may include a second semiconductor substrate 302, and the first layer 310 and the second layer 320 may be stacked in a vertical direction (Z-axis direction) perpendicular to an upper surface of the first semiconductor substrate 301 and/or the second semiconductor substrate 302.

A plurality of first semiconductor elements may be disposed in the first layer 310, and each of the plurality of first semiconductor elements may include an active region 311 and a gate structure 315. The gate structure 315 may include a gate insulating layer 312, a gate electrode layer 313, and a gate spacer 314. The plurality of first semiconductor elements may be connected to elements contacts 316 and wiring patterns 317, and the elements contacts 316 and the wiring patterns 317 may be disposed in an interlayer insulating layer 318.

A structure of the second layer 320 may be similar to that of the first layer 310. A plurality of second semiconductor elements may be disposed in the second layer 320, each of the plurality of second semiconductor elements may include an active region 321 and a gate structure 325, the gate structure 325 may include a gate insulating layer 322, a gate electrode layer 323, and a gate spacer 324. The plurality of second semiconductor elements may be connected to elements contacts 326 and wiring patterns 327, and the elements contacts 326 and the wiring patterns 327 may be disposed in an interlayer insulating layer 328.

For example, the plurality of first semiconductor elements disposed in the first layer 310 may provide combinational logic circuits such as an adder, a multiplier, a multiplexer, and an encoder, and the plurality of second semiconductor elements disposed in the second layer 320 may provide clock gate circuits, sequential logic circuits, power supply circuits, buffer circuits, and the like. As described above with reference to FIGS. 5 and 6, the degree of integration in which the plurality of first semiconductor elements are disposed in the first layer 310 may be higher than the degree of integration in which the plurality of second semiconductor elements are disposed in the second layer 320. Accordingly, the number of a plurality of first semiconductor elements may be greater than the number of the plurality of second semiconductor elements.

The first semiconductor substrate 301 may be attached onto the interlayer insulating layer 328 of the second layer 320. For example, the first semiconductor substrate 301 and the second semiconductor substrate 302 may be formed from separate wafers. In an exemplary embodiment, the first semiconductor substrate 301 may be formed by attaching a wafer onto the interlayer insulating layer 328 of the second layer 320 and separating a partial portion of the wafer. The wafer attached onto the interlayer insulating layer 328 of the second layer 320 may be doped with impurities in advance by an ion implantation process, and the thickness of the first semiconductor substrate 301 may vary depending on a depth of a region doped with the impurities. For example, the first semiconductor substrate 301 may have a smaller thickness than the second semiconductor substrate 302.

Referring to FIG. 7, at least some of the plurality of first semiconductor elements and at least some of the plurality of second semiconductor elements may be connected to each other by a plurality of interlayer vias 330 penetrating through the first semiconductor substrate 301 and extending in the vertical direction. In the exemplary embodiment illustrated in FIG. 7, each of the plurality of interlayer vias 330 may be connected between an uppermost-layer wiring pattern among the wiring patterns 327 of the second layer 320 and a lowermost-layer wiring pattern among the wiring patterns 317 of the first layer 310. However, this is merely an exemplary embodiment, and the length and structure of each of the plurality of interlayer vias 330 may be modified in various ways.

Each of the plurality of interlayer vias 330 may be formed to have a width of 100 nm or less. By limiting the width of each of the plurality of interlayer vias 330 in this way, it is possible to minimize damage to the first semiconductor substrate 301 that may occur in a process of forming the plurality of interlayer vias 330. In addition, since the plurality of interlayer vias 330 can be formed without the burden of damage to the first semiconductor substrate 301, the plurality of first semiconductor elements and the plurality of second semiconductor elements may be formed in regions immediately adjacent to the interlayer via regions where the plurality of interlayer vias 330 are disposed as described with reference to FIGS. 5 and 6.

Figure 8:
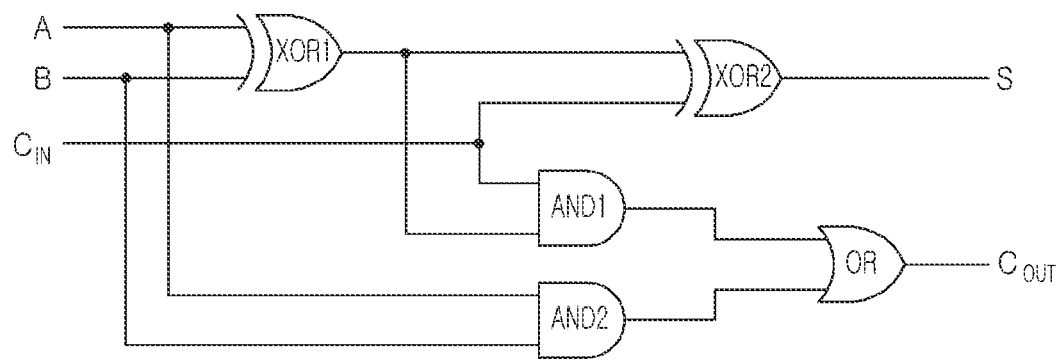
FIGS. 8 and 9 are examples of combinational logic circuits included in a semiconductor device according to an exemplary embodiment of the present disclosure.
Figure 9:
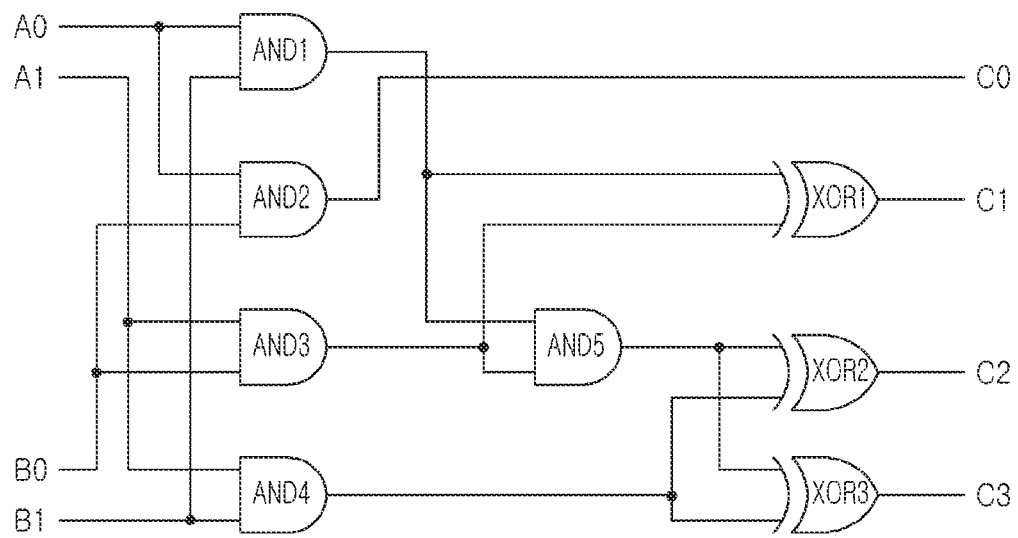

FIGS. 8 and 9 are examples of combinational logic circuits included in a semiconductor device according to an exemplary embodiment of the present disclosure.

FIG. 8 is a circuit diagram illustrating an adder, which is one of the combinational logic circuits included in a semiconductor device according to an exemplary embodiment of the present disclosure. Referring to FIG. 8, the adder may include first and second XOR gates XOR1 and XOR2, first and second AND gates AND1 and AND2, and an OR gate OR. The adder may receive first input data A and second input data B, which are 1-bit data, and input carry data $C_{IN}$ transferred from a previous digit number, and output sum data S and output carry data $C_{OUT}$ based thereon. For example, the operation of the adder illustrated in FIG. 8 may be as shown in Table 1 below.

TABLE 1

| A | B | $C_{IN}$ | S | $C_{OUT}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Meanwhile, FIG. 9 may be a circuit diagram illustrating a multiplier, which is one of the combinational logic circuits included in a semiconductor device according to an exemplary embodiment of the present disclosure. Referring to FIG. 9, the multiplier may include first to sixth AND gates AND1 to AND6 and first and second XOR gates XOR1 and XOR2. The multiplier according to the exemplary embodiment illustrated in FIG. 9 may perform an operation of multiplying first input data and second input data, the first input data including a first upper bit A1 and a first lower bit A0, and the second input data including a second upper bit B1 and a second lower bit B0. The multiplier may output output data including four bits C0 to C3 by performing the operation of multiplying the first input data and the second input data, which are 2-bit data.

As described with reference to FIGS. 8 and 9, the combinational logic circuits such as an adder and a multiplier may operate without being synchronized with a clock signal. Also, an output of the combinational logic circuit may be determined only based on a current input received by the combinational logic circuit, regardless of previous inputs. Therefore, if the combinational logic circuits are disposed together with clock gate circuits determining whether to transmit or block clock signals, sequential input circuits operating in synchronization with clock signals, and the like, this may cause a deterioration in degree of integration of the semiconductor device. In addition, it is required that paths for transmitting the clock signals to the sequential input circuits, which are disposed in a distributed manner, be disposed in the semiconductor device, resulting in a deterioration in RC characteristics, which may be accompanied by a deterioration in response speed of the semiconductor device and an increase in power consumption of the semiconductor device.

In an exemplary embodiment of the present disclosure, combinational logic circuits each operating regardless of a clock signal may be formed in a separate semiconductor substrate from sequential logic circuits each operating by receiving a clock signal. The semiconductor substrate on which the combinational logic circuits are formed and the semiconductor substrate on which the sequential logic circuits are formed may be stacked on each other, and may be electrically connected to each other by interlayer vias penetrating through at least one of the semiconductor substrates.

As a result, the sequential logic circuits may be disposed on a different semiconductor substrate from the combinational logic circuits, and the sequential logic circuits and combinational logic circuits may be connected to each other through the interlayer vias if necessary. Therefore, the combinational logic circuits and the sequential logic circuits can be disposed on the separate semiconductor substrates in a distributed manner achieving a high degree of integration, thereby improving the overall degree of integration of the semiconductor device. In addition, the paths for transmitting clock signals input to the sequential logic circuits can be shortened, and the RC characteristics can be improved, thereby reducing the power consumption of the semiconductor device.

Figure 10:
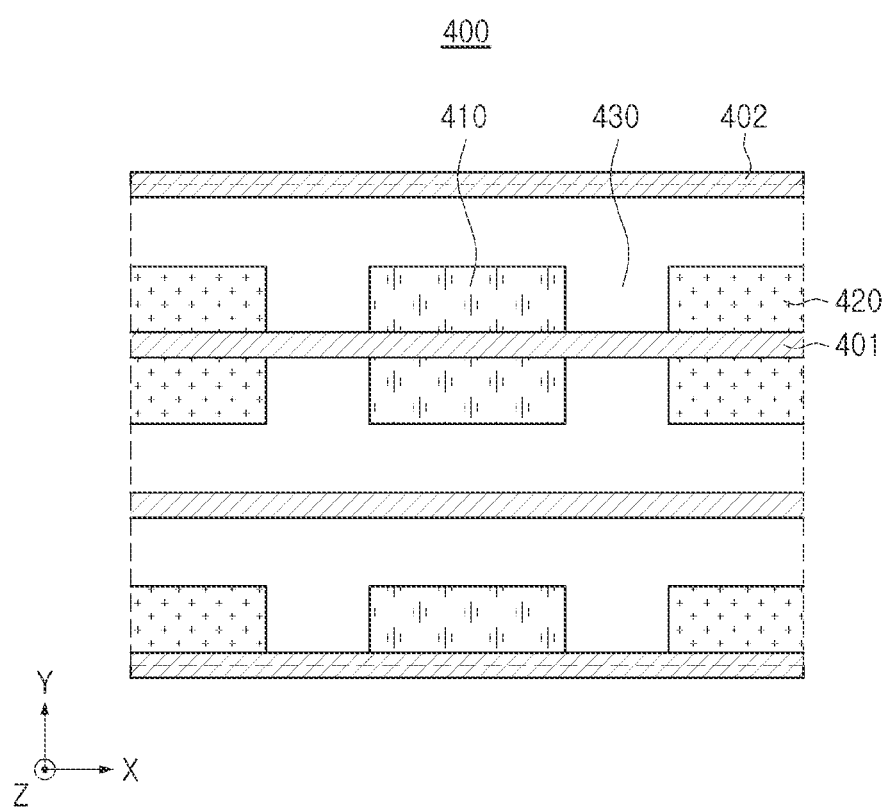
FIG. 10 is a diagram schematically illustrating a partial region of a layer different from a layer in which combinational logic circuits are disposed in a semiconductor device according to an exemplary embodiment of the present disclosure.

FIG. 10 is a diagram schematically illustrating a partial region of a layer different from a layer in which combinational logic circuits are disposed in a semiconductor device according to an exemplary embodiment of the present disclosure.

A semiconductor device according to an exemplary embodiment of the present invention may include a first layer and a second layer stacked on each other, and circuits having different characteristics may be disposed in the first layer and the second layer. For example, circuits for performing calculations may be mainly disposed in the first layer, and circuits for generating clock signals, power supply voltages, and the like, amplifying the power supply voltages, or temporarily storing data may be mainly disposed in the second layer.

FIG. 10 is a diagram illustrating a partial region of a second layer 400 included in the semiconductor device. Referring to FIG. 10, the second layer 400 may include a plurality of power supply voltage lines 401 and a plurality of reference voltage lines 402 extending in a first direction (X-axis direction) and arranged in a second direction (Y-axis direction). Each of the plurality of power supply voltage lines 401 may supply a first power supply voltage, and each of the plurality of reference voltage lines 402 may supply a reference voltage lower than the first power supply voltage.

Meanwhile, the second layer 400 may include a first well region 410, a second well region 420, and a third well region 430 disposed under each of the plurality of power supply voltage lines 401. The first well region 410 and the second well region 420 may be isolated from each other by the third well region 430. The first well region 410 and the second well region 420 may include first conductivity type impurities, and may be doped with first conductivity type impurities at different concentrations. On the other hand, the third well region 430 may be doped with second conductivity type impurities different from the first conductivity type impurities. For example, PMOS transistors may be formed in each of the first well region 410 and the second well region 420, and NMOS transistors may be formed in the third well region 430.

The PMOS transistors disposed in the first well region 410 may receive a first power supply voltage through the plurality of power supply voltage lines 401, and the PMOS transistors disposed in the second well region 420 may receive a second power supply voltage through a different path from the plurality of power supply voltage lines 401. For example, the second power supply voltage having a different level from the first power supply voltage supplied through the plurality of power supply voltage lines 401 may be input to source terminals and body terminals of the PMOS transistors disposed in the second well region 420. Therefore, the first well region 410 and the second well region 420 need to be isolated from each other by the third well region 430 as illustrated in FIG. 10.

As illustrated in FIG. 10, a circuit implemented with the transistors in the first well region 410 and the second well region 420 isolated from each other may be a power circuit such as a power gate circuit or a level shifter circuit in an exemplary embodiment. In another exemplary embodiment of the present invention, combinational logic circuits may be disposed in the first layer, and power circuits including transistors formed in a distributed manner in well regions isolated from each other may be disposed in the second layer. As a result, the well regions isolated from each other as illustrated in FIG. 10 may not be formed in the first layer, thereby improving the degree of integration of the semiconductor device.

FIGS. 11A to 11E are examples of circuits included in a semiconductor device according to an exemplary embodiment of the present disclosure.

The sequential logic circuits 500 to 540 to be described with reference to FIGS. 11A to 11E may be disposed together in one layer in a semiconductor device according to an exemplary embodiment of the present disclosure.

For example, the layer in which the sequential logic circuits 500 to 540 are disposed may be a layer in which no combinational logic circuits are disposed or a relatively small number of combinational logic circuits are disposed. Assuming that the semiconductor device includes a first layer and a second layer, and more combinational logic circuits are disposed in the first layer than in the second layer, the sequential logic circuits 500 to 540 may be disposed in the second layer.

Figure 11A:
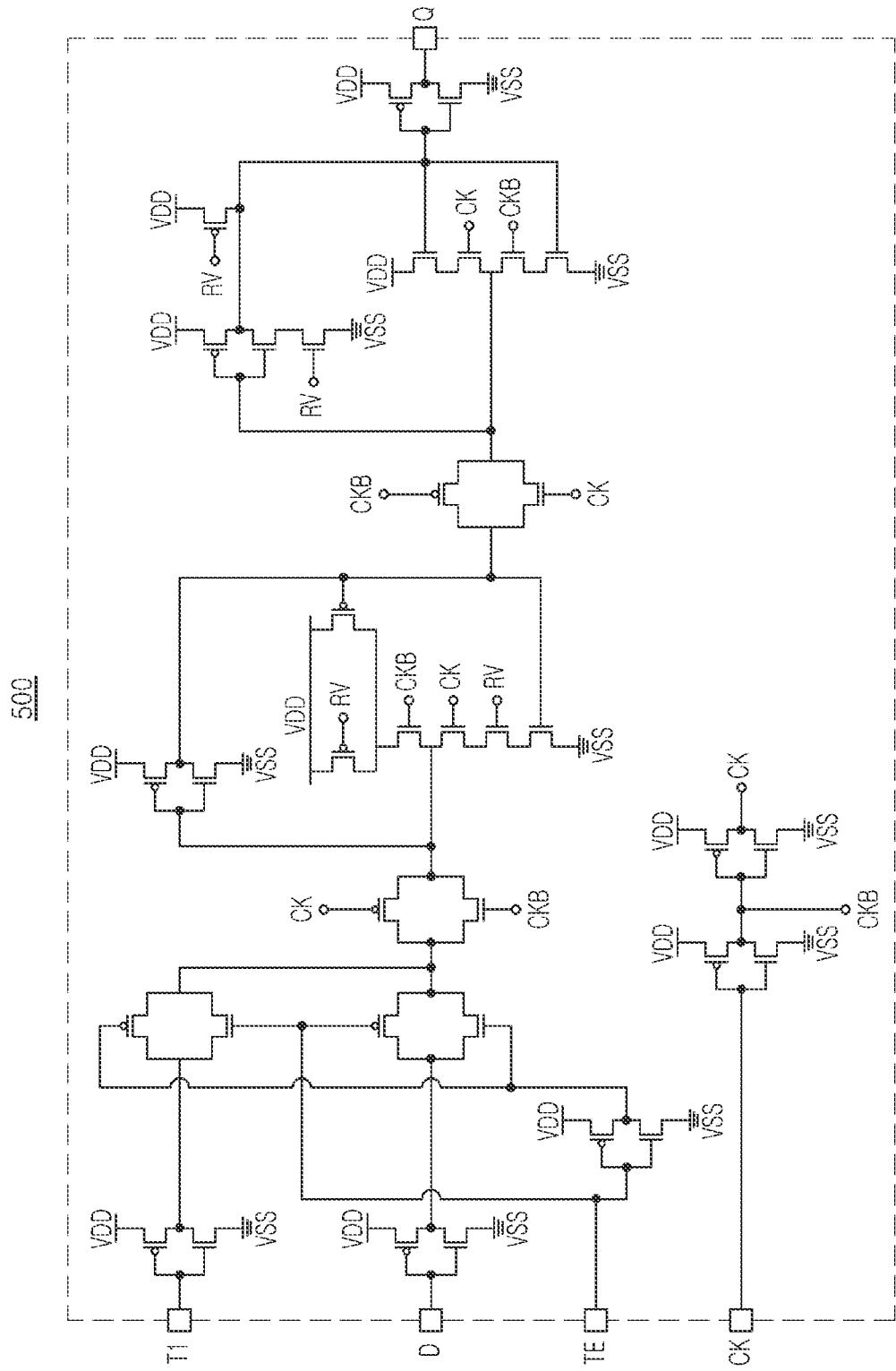
FIGS. 11A to 11E are examples of circuits included in a semiconductor device according to an exemplary embodiment of the present disclosure.

FIG. 11A may be a circuit diagram schematically illustrating a flip-flop circuit 500 among sequential logic circuits included in a semiconductor device according to an exemplary embodiment of the present disclosure. Referring to FIG. 11A, the flip-flop circuit 500 may include PMOS transistors and NMOS transistors, and operate using a first power supply voltage VDD and a reference voltage VSS as power sources. The PMOS transistors and the NMOS transistors may be controlled by a clock signal CK, a complementary clock signal CKB, input data D, a test input signal TI, an inverted reset signal RN, a test enable signal TE, or the like. Output data Q output from the flip-flop circuit 500 may be determined based on input data D, a clock signal CK, or the like.

The flip-flop circuit 500 described with reference to FIG. 11A may operate as a memory circuit temporarily storing data, or may be combined with other elements to provide another type of circuit. As an example, referring to FIG. 11B, a clock gate circuit 510 may be implemented by connecting a latch circuit to an OR gate and an AND gate. The clock gate circuit 510 may be provided for the purpose of reducing power consumption of sequential logic circuits each operating by receiving a clock signal.

Figure 11B:
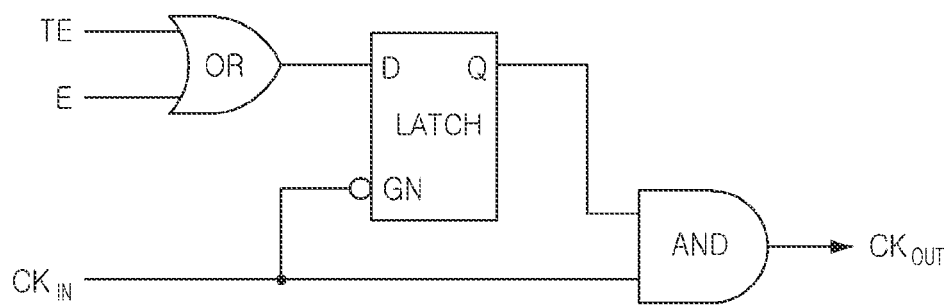

Referring to FIG. 11B, the clock gate circuit 510 may include an OR gate receiving a test enable signal TE and an enable signal E, a latch circuit receiving an output of the OR gate and controlled based on a complementary signal of an input clock signal $CK_{IN}$, and an AND gate outputting an output clock signal $CK_{OUT}$. By implementing the clock gate circuit 510 as illustrated in FIG. 11B, glitches that may appear in the output clock signal $CK_{OUT}$ can be effectively suppressed.

Each of the flip-flop circuit 500 and the clock gate circuit 510 described with reference to FIGS. 11A and 11B may receive a test enable signal TE. For example, the flip-flop circuit 500 may operate in a test mode while the test enable signal TE has a high logic level. Referring to FIG. 11A, while the test enable signal TE has a high logic level, the test input signal TI, rather than the input data D, may be reflected in the output data Q.

In an exemplary embodiment of the present disclosure, transmission paths for transferring a test enable signal TE, a test input signal TI, a clock signal CK, and the like to the flip-flop circuit 500 may be disposed in the second layer together with the flip-flop circuit 500. Also, a transmission path for transferring a test enable signal TE to the clock gate circuit 510 may be disposed in the second layer together with the clock gate circuit 510. In addition, buffers and the like required to transfer the test enable signal TE and the test input signal TI may also be disposed in the second layer together. As a result, the paths for transmitting the test enable signal TE, the test input signal TI, and the like can be implemented without passing through interlayer vias.

In other words, in an exemplary embodiment of the present disclosure, the paths for transmitting signals to be input to the flip-flop circuit 500 and the clock gate circuit 510 may be disposed in the second layer together with the flip-flop circuit 500 and the clock gate circuit 510. However, circuits generating signals to be input to the flip-flop circuit 500 and the clock gate circuit 510 may be disposed in the first layer in certain exemplary embodiments. In addition, among flip-flop circuits 500 and clock gate circuits 510, some circuits that may greatly affect the operation timing of the combinational logic circuits may be disposed in the first layer.

Figure 11C:
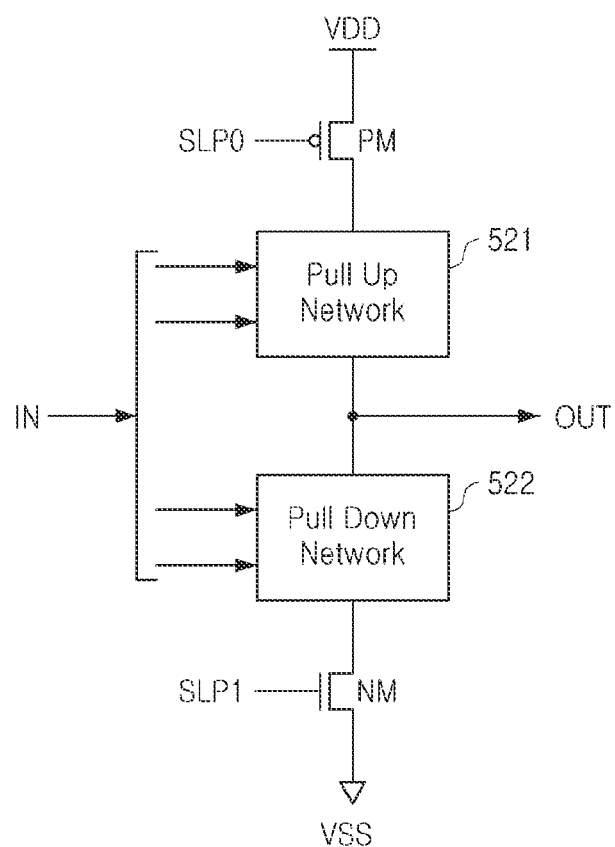

FIG. 11C is a circuit diagram schematically illustrating a power gate circuit 520 included in a semiconductor device according to an exemplary embodiment of the present disclosure. Referring to FIG. 11C, the power gate circuit 520 may include a PMOS transistor PM receiving a first power supply voltage VDD, an NMOS transistor NM receiving a reference voltage VSS, a pull-up network 521, and a pull-down network 522. For example, the pull-up network 521 may include a plurality of PMOS transistors, and the pull-down network 522 may include a plurality of NMOS transistors.

The PMOS transistor PM may be controlled based on a first sleep signal SLP0, and the NMOS transistor NM may be controlled based on a second sleep signal SLP1. The first sleep signal SLP0 and the second sleep signal SLP1 may be complementary signals. In a normal operation mode, the first sleep signal SLP0 may have a low logic level, and accordingly, the PMOS transistor PM and the NMOS transistor NM may be turned on. For example, the PMOS transistor PM and the NMOS transistor NM may be designed to have a relatively higher threshold voltage than the transistors included in the pull-up network 521 and the pull-down network 522, thereby obtaining a leakage power reducing effect in the normal operation mode.

Figure 11D:
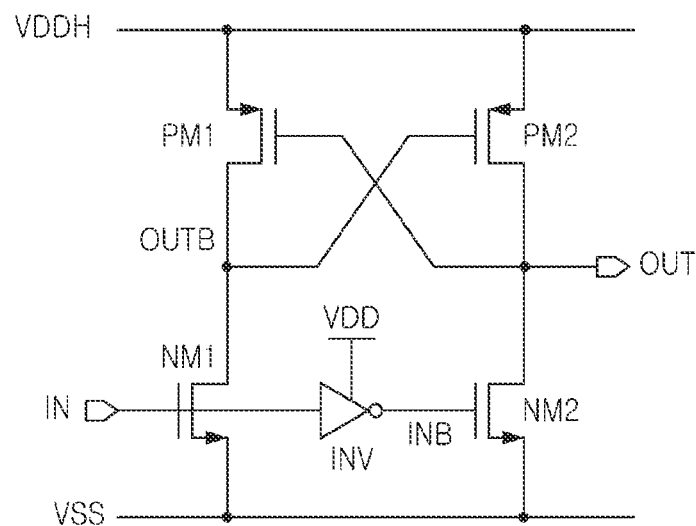

FIG. 11D is a circuit diagram schematically illustrating a level shifter circuit 530 included in a semiconductor device according to an exemplary embodiment of the present disclosure. Referring to FIG. 11D, the level shifter circuit 530 may include a plurality of PMOS transistors PM1 and PM2, a plurality of NMOS transistors NM1 and NM2, and an inverter INV. An input signal IN may be input to a gate of the first NMOS transistor NM1, and an inverted input signal INB output from the inverter INV may be input to a gate of the second NMOS transistor NM2.

Referring to FIG. 11D, the inverter INV may be operated by a first power supply voltage VDD, and a source terminal of each of the plurality of NMOS transistors NM1 and NM2 may receive a reference voltage VSS. Meanwhile, a source terminal of each of the plurality of PMOS transistors PM1 and PM2 may receive a second power supply voltage VDDH having a higher level than the first power supply voltage VDD.

In order to implement the level shifter circuit 530 as illustrated in FIG. 11D, a PMOS transistor formed in a well region to which the first power supply voltage VDD is input and constituting the inverter INV, and the plurality of PMOS transistors PM1 and PM2 formed in another well region to which the second power supply voltage VDDH is input may be required. Therefore, as described above with reference to FIG. 10, the level shifter circuit 530 may be disposed in well regions isolated from each other.

In an exemplary embodiment of the present disclosure, the power gate circuit 520 and the level shifter circuit 530 described with reference to FIGS. 11C and 11D may be disposed in the second layer different from the first layer in which combinational logic circuits are mainly disposed. By disposing circuits requiring well regions doped with impurities of different concentrations in a layer other than the layer where the combinational logic circuits are disposed, the degree of integration of the semiconductor device can be improved.

Figure 11E:
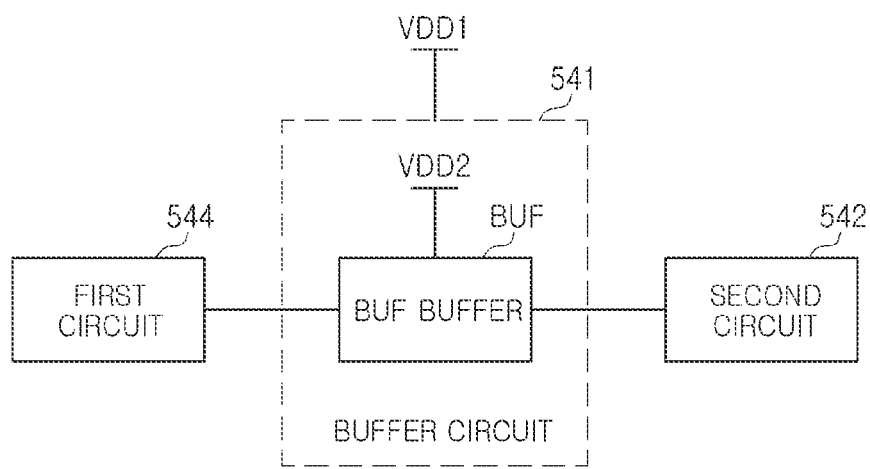

FIG. 11E is a diagram illustrating a multi-power buffer 540 included in a semiconductor device according to an exemplary embodiment of the present disclosure.

Referring to FIG. 11E, the multi-power buffer 540 may be connected between a first circuit 541 and a second circuit 542. The multi-power buffer 540 may include an individual buffer BUF, the multi-power buffer 540 may be operated by a first power supply voltage VDD1, and the individual buffer BUF may be operated by a second power supply voltage VDD2 supplied independently from the first power supply voltage VDD1.

In the exemplary embodiment illustrated in FIG. 11E, even when the level of the first power supply voltage VDD1 decreases for the purpose of reducing power consumption of the semiconductor device, the level of the second power supply voltage VDD2 may remain constant. Accordingly, the buffer BUF for relaying signals between the first circuit 541 and the second circuit 542 may operate normally.

Since the multi-power buffer 540 is implemented by the first power supply voltage VDD1 and the second power supply voltage VDD2 that may be independently controlled at different levels, the multi-power buffer 540 may include transistors formed in well regions doped with impurities of different concentrations. Therefore, similarly to what has been described above with reference to FIGS. 11C and 11D, the multi-power buffer 540 may be formed in the second layer rather than the first layer in which combinational logic circuits are mainly disposed in the semiconductor device. Accordingly, the degree of integration of the first layer in which combinational logic circuits are disposed can be increased, and as a result, the degree of integration of the semiconductor device can be improved.

Figure 12:
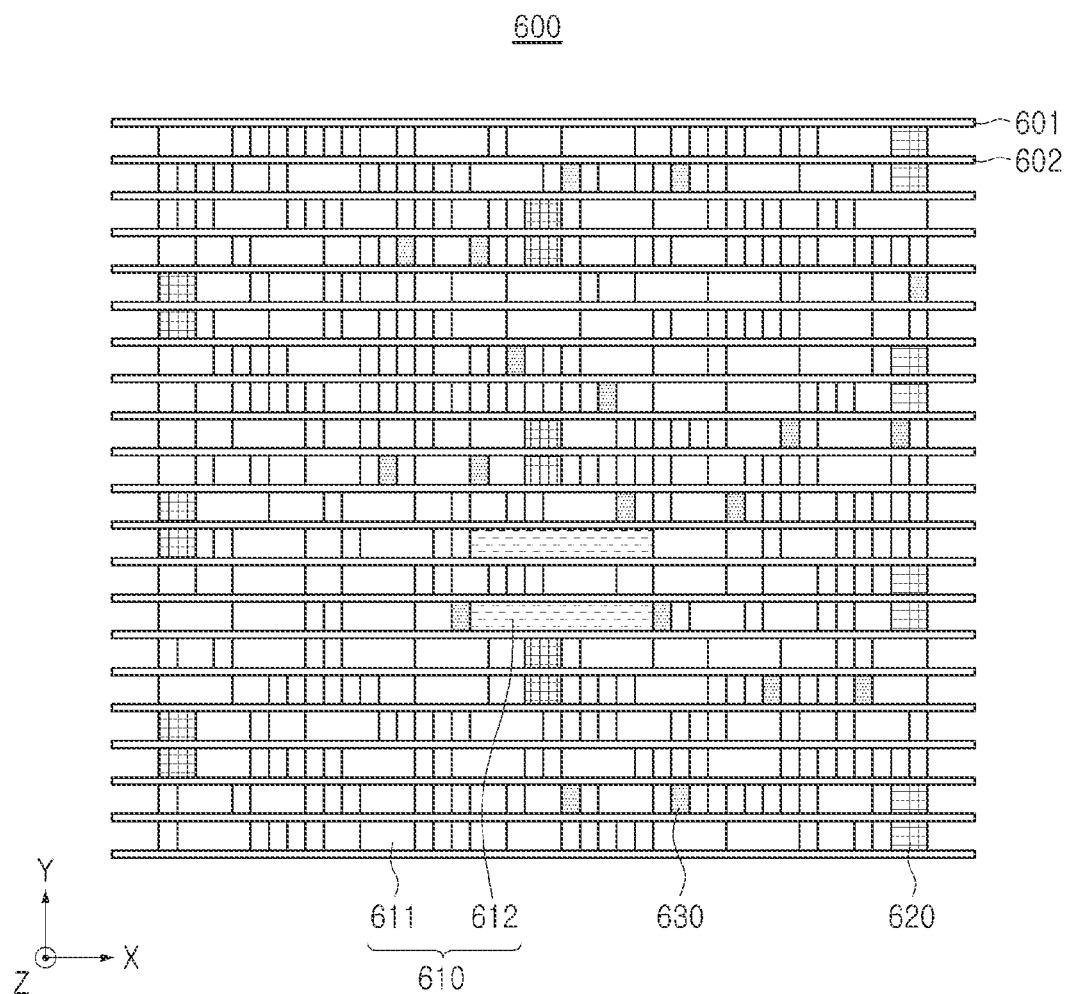
FIGS. 12 and 13 are diagrams provided to describe a structure of a semiconductor device according to an exemplary embodiment of the present disclosure.
Figure 13:
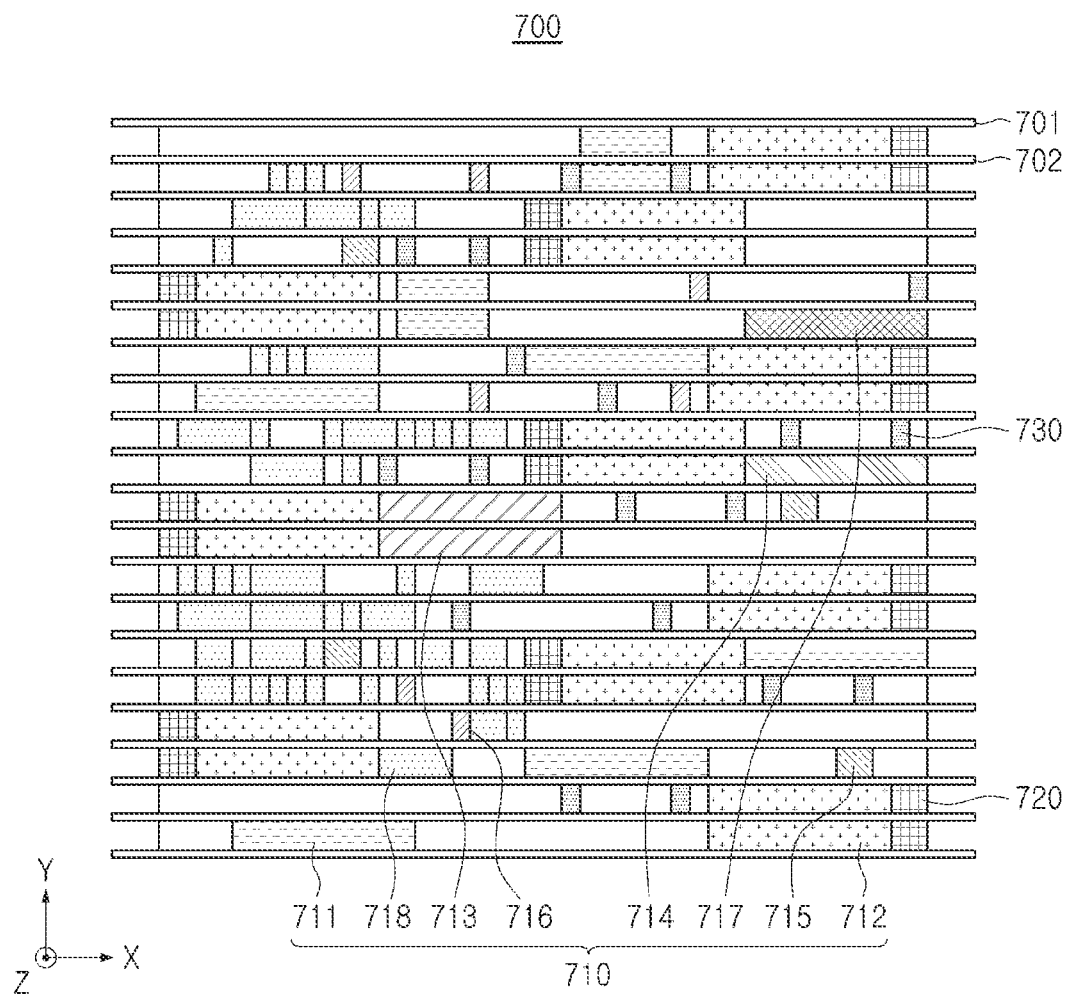

FIGS. 12 and 13 are diagrams provided to describe a structure of a semiconductor device according to an exemplary embodiment of the present disclosure.

FIGS. 12 and 13 may be diagrams schematically illustrating respective structures of a first layer 600 and a second layer 700 included in a semiconductor device according to an exemplary embodiment of the present disclosure. The first layer 600 may include a first semiconductor substrate, the second layer 700 may include a second semiconductor substrate, and the first layer 600 and the second layer 700 may be stacked in a vertical direction (Z-axis direction) perpendicular to an upper surface of the first semiconductor substrate.

Referring to FIG. 12, the first layer 600 may include a plurality of first standard cells 610 arranged along a first direction (X-axis direction) and a second direction (Y-axis direction), and a plurality of first interlayer vias regions 620 and 630. In addition, the first layer 600 may include a plurality of power supply voltage lines 601 and a plurality of reference voltage lines 602 extending in the first direction. The plurality of power supply voltage lines 601 and the plurality of reference voltage lines 602 may be alternately disposed along the second direction.

The plurality of first standard cells 610 may include first combinational logic standard cells 611 providing combinational logic circuits each operating regardless of a clock signal, and first sequential logic standard cells 612 providing sequential logic circuits each operating by receiving a clock signal. However, as illustrated in FIG. 12, the first combinational logic standard cells 611 may occupy a larger area of the first layer 600 than the first sequential logic standard cells 612.

Meanwhile, the plurality of first interlayer via regions 620 and 630 may include first power supply via regions 620 and first input/output via regions 630. For example, a power supply voltage may be transferred between the first layer 600 and the second layer 700 through power supply interlayer vias disposed in the respective first power supply via regions 620. Also, an input signal and/or an output signal may be transferred between the first layer 600 and the second layer 700 through input/output interlayer vias disposed in the respective first input/output via regions 630.

Next, referring to FIG. 13, the second layer 700 may include a plurality of second standard cells 710 and a plurality of second interlayer via regions 720 and 730. Similarly to the first layer 600, the second layer 700 may also include a plurality of power supply voltage lines 701 and a plurality of reference voltage lines 702. The plurality of power supply voltage lines 701 supplying a first power supply voltage and the plurality of reference voltage lines 702 supplying a reference voltage may be alternately disposed in the second direction.

The plurality of second standard cells 710 may include second sequential logic standard cells 711 to 717 providing sequential logic circuits, and second combinational logic standard cells 718 providing combinational logic circuits. For example, the second sequential logic standard cells 711 to 717 may provide memory circuits 711 such as latches and flip-flops, power circuits 712 and 713, clock gate circuits 714, buffer circuits 715 to 717, and combinational logic circuits 718. The power circuits 712 and 713 may include a power gate circuit 712 and a power buffer 713. In an exemplary embodiment, the power buffer 713 may include a level shifter circuit and the like, and semiconductor elements providing the power circuits 712 and 713 may be formed in a plurality of regions doped with impurities of different concentrations. The clock gate circuits 714 and the buffer circuits 715 to 717 may be understood with reference to the foregoing description.

Meanwhile, as illustrated in FIG. 13, the second layer 700 of the semiconductor device according to an exemplary embodiment of the present disclosure may include a plurality of second interlayer via regions 720 and 730. The plurality of second interlayer via regions 720 and 730 may include second power supply via regions 720 and second input/output via regions 730. The positions where the second power supply via regions 720 are disposed in the second layer 700 may be identical to positions where the first power supply via regions 620 are disposed in the first layer 600. Similarly, positions where the second input/output via regions 730 are disposed in the second layer 700 may be identical to positions where the first input/output via regions 630 are disposed in the first layer 600. Accordingly, a plurality of interlayer vias may extend in a vertical direction in the power supply via regions 620 and 720 and the input/output via regions 630 and 730 to connect the first layer 600 and the second layer 700 to each other.

As compared to the exemplary embodiment described with reference to FIGS. 5 and 6, in the exemplary embodiment shown in FIGS. 12 and 13, some of the sequential logic circuits may be formed in the first layer 600 by the first sequential logic standard cells 612, and some of the combinational logic circuits implemented by the second combinational logic standard cells 718 may be disposed in the second layer 700. The first sequential logic standard cells 612 disposed in the first layer 600 may provide, for example, memory circuits such as latches and/or flip-flops.

The first sequential logic standard cells 612 may provide memory circuits included in a timing critical path that greatly affects the operation of the semiconductor device. By implementing the memory circuits included in the timing critical path with the first sequential logic standard cells 612 disposed in the first layer 600, some of the first combinational logic standard cells 611 and the first sequential logic standard cells 612 may be included in the timing critical path of the first layer 600 without interlayer vias. As a result, both the degree of integration and performance of the semiconductor device can be improved.

In addition, in the exemplary embodiment illustrated in FIGS. 12 and 13, standard cells providing combinational logic circuits are not disposed only in the first layer 600, and the second combinational logic standard cells 718 may be disposed in the second layer 700. For example, if advantages can be obtained in terms of power, performance, and area by disposing the second combinational logic standard cells 718 in the second layer 700, the second combinational logic standard cells 718 providing combinational logic circuits may also be disposed in the second layer 700 as illustrated in FIG. 13.

In other words, in the semiconductor device according to the exemplary embodiment described with reference to FIGS. 12 and 13, the first sequential logic standard cells 612 may also be disposed in the first layer 600, and the second combinational logic standard cells 718 may also be disposed in the second layer 700. However, the number of first combinational logic standard cells 611 disposed in the first layer 600 may be larger than the number of second combinational logic standard cells 718 disposed in the second layer 700, and each of the first combinational logic standard cells 611 disposed in the first layer 600 may have an area larger than that of each of the second combinational logic standard cells 718 disposed in the second layer 700. Also, the number of second sequential logic standard cells 711 to 717 disposed in the second layer 700 may be larger than the number of first sequential logic standard cells 612 disposed in the first layer 600, and each of the second sequential logic standard cells 711 to 717 disposed in the second layer 700 may have an area larger than that of each of the first sequential logic standard cells 612 disposed in the first layer 600.

Meanwhile, the first combinational logic standard cells 611 may occupy a larger area of the first layer 600 than the first sequential logic standard cells 612, and the second sequential logic standard cells 711 to 717 may occupy a larger area of the second layer 700 than the second combinational logic standard cells 718. In addition, all of the paths for transmitting signals that are not directly related to operations, for example, a set/reset signal and a test enable signal to be input to the memory circuit 711 and a test enable signal or a sleep signal to be input to the power gate circuit 712, may be disposed in the second layer 700.

According to exemplary embodiments of the present disclosure, combinational logic circuits may be mainly disposed in one of the layers included in the semiconductor device, and sequential logic circuits may be mainly disposed in the other layer. As a result, the degree of integration of the semiconductor device can be increased, thereby reducing the power consumption of the semiconductor device and improving the performance of the semiconductor device.

While exemplary embodiments have been illustrated and described above, it will be apparent to those skilled in the art that modifications and variations could be made without departing from the scope and spirit of the present inventive concept as defined by the appended claims.

What is claimed is:

1. A semiconductor device comprising:
a first layer including a first semiconductor substrate, a plurality of first standard cell regions in the first semiconductor substrate, a plurality of first standard cells disposed in the plurality of first standard cell regions, and a plurality of first wiring patterns connected to the plurality of first standard cells; and
a second layer including a second semiconductor substrate, a plurality of second standard cell regions in the second semiconductor substrate, a plurality of second standard cells disposed in the plurality of second standard cell regions, and a plurality of second wiring patterns connected to the plurality of second standard cells, the second layer being stacked with the first layer in a vertical direction perpendicular to an upper surface of the first semiconductor substrate,
wherein the plurality of first standard cells comprise first combinational logic circuits,
wherein the plurality of second standard cells are electrically connected to the plurality of first standard cells and comprise sequential logic circuits, a clock gate circuit, and second combinational logic circuits,
wherein the plurality of second standard cells further comprise at least one of a power gate circuit or a level shifter circuit,
wherein the plurality of second wiring patterns comprise a transfer path for transmitting at least one of a scan signal or a scan enable signal to the sequential logic circuits included in the second layer, and
wherein at least one of the second combinational logic circuits is connected to the transfer path.

2. The semiconductor device of claim 1, wherein in the second layer, the sequential logic circuits and the clock gate circuit are powered by a first power supply voltage, and the at least one of the power gate circuit or the level shifter circuit is powered by a second power supply voltage different from the first power supply voltage.

3. The semiconductor device of claim 2, wherein semiconductor elements forming the sequential logic circuits and the clock gate circuit are disposed in a first well region to which the first power supply voltage is input, semiconductor elements forming the at least one of the power gate circuit or the level shifter circuit are disposed in a second well region to which the second power supply voltage is input, and an isolation region for isolating the first well region and the second well region from each other is disposed between the first well region and the second well region.

4. The semiconductor device of claim 1, wherein the first layer includes a plurality of first interlayer via regions disposed between different first standard cell regions of the plurality of first standard cell regions, and
the second layer includes a plurality of second interlayer via regions disposed between different second standard cell regions of the plurality of second standard cell regions.

5. The semiconductor device of claim 4, wherein the plurality of first interlayer via regions and the plurality of second interlayer via regions overlap each other in the vertical direction, and
at least two of the plurality of first standard cells and at least two of the plurality of second standard cells are connected to each other by a plurality of interlayer vias extending in the vertical direction in the plurality of first interlayer via regions and the plurality of second interlayer via regions.

6. The semiconductor device of claim 5, wherein each of the plurality of interlayer vias has a diameter of 100 nm or less.

7. The semiconductor device of claim 4, wherein each of the plurality of second interlayer via regions is disposed adjacent to the power gate circuit in a direction parallel to an upper surface of the second semiconductor substrate.

8. The semiconductor device of claim 1, wherein the plurality of second standard cells comprise a buffer and an inverter connected to the transfer path.

9. The semiconductor device of claim 1, wherein both of the power gate circuit and the level shifter circuit are included in the second layer.

10. The semiconductor device of claim 1, wherein the power gate circuit is included in the first layer, and the level shifter circuit is included in the second layer.

11. The semiconductor device of claim 8, wherein the power gate circuit is included in the second layer, and the level shifter circuit is included in the first layer.

12. The semiconductor device of claim 1, wherein a number of the plurality of first standard cells is larger than a number of the plurality of second standard cells.

13. A semiconductor device comprising:
a first layer including a first semiconductor substrate, a plurality of first semiconductor elements disposed on the first semiconductor substrate, and a plurality of first wiring patterns connected to the plurality of first semiconductor elements; and
a second layer stacked with the first layer in a direction perpendicular to an upper surface of the first semiconductor substrate, and including a second semiconductor substrate, a plurality of second semiconductor elements disposed on the second semiconductor substrate, and a plurality of second wiring patterns connected to the plurality of second semiconductor elements,
wherein the plurality of first semiconductor elements and the plurality of second semiconductor elements form combinational logic standard cells comprising combinational logic circuits and sequential logic standard cells comprising sequential logic circuits,
wherein a number of first combinational logic standard cells included in the first layer is larger than a number of second combinational logic standard cells included in the second layer,
wherein the plurality of second wiring patterns includes a transfer path for transmitting at least one of a scan signal or a scan enable signal to the sequential logic circuits included in the second layer, and
wherein at least one second combinational logic circuit included in the second combination logic standard cells is connected to the transfer path.

14. The semiconductor device of claim 13, wherein at least two of the plurality of first wiring patterns are connected to at least two of the plurality of second wiring patterns by a plurality of interlayer vias penetrating through the first semiconductor substrate or the second semiconductor substrate.

15. The semiconductor device of claim 13, wherein a number of first sequential logic standard cells disposed in the first layer is smaller than a number of second sequential logic standard cells disposed in the second layer.

16. The semiconductor device of claim 13, wherein the second layer includes a first well region and a second well region isolated from each other and doped with different concentrations of a same conductivity type of impurities.

17. The semiconductor device of claim 16, wherein the first layer does not include separate well regions doped with different concentrations of the same conductivity type of impurities.

18. A semiconductor device comprising:
a first layer including a plurality of first standard cells arranged along a direction parallel to an upper surface of a first semiconductor substrate, the plurality of first standard cells including a plurality of first combinational logic standard cells comprising first combinational logic circuits and a plurality of first sequential logic standard cells comprising first sequential logic circuits; and
a second layer including a plurality of second standard cells stacked with the first layer in a vertical direction perpendicular to the upper surface of the first semiconductor substrate, the plurality of second standard cells including a plurality of second combinational logic standard cells comprising second combinational logic circuits and a plurality of second sequential logic standard cells comprising second sequential logic circuits,
wherein an area of the plurality of first combinational logic standard cells is larger than an area of the plurality of second combinational logic standard cells,
wherein an area of the plurality of first sequential logic standard cells is smaller than an area of the plurality of second sequential logic standard cells,
wherein the second layer includes wiring patterns configured to transmit at least one of a scan signal or a scan enable signal to the plurality of second sequential logic standard cells, and
wherein at least one of the second sequential logic circuits is connected to the wiring patterns.

19. The semiconductor device of claim 18, further comprising:
a plurality of first interlayer via regions disposed between different first standard cells of the plurality of first standard cells, and a plurality of second interlayer via regions disposed between different second standard cells of the plurality of second standard cells,
wherein the plurality of first interlayer via regions and the plurality of second interlayer via regions overlap each other in the vertical direction.

20. The semiconductor device of claim 19, further comprising a plurality of interlayer vias extending in the vertical direction in the plurality of first interlayer via regions and the plurality of second interlayer via regions, respectively,
wherein each of the plurality of interlayer vias has a width of 100 nm or less.

* * * * *